United States Patent [19]
Massingill

[11] Patent Number: 5,947,751
[45] Date of Patent: Sep. 7, 1999

[54] PRODUCTION AND TEST SOCKET FOR BALL GRID ARRAY SEMICONDUCTOR PACKAGE

[75] Inventor: Thomas J. Massingill, Scotts Valley, Calif.

[73] Assignee: VlSI Technology, Inc., San Jose, Calif.

[21] Appl. No.: 09/054,937

[22] Filed: Apr. 3, 1998

[51] Int. Cl.$^6$ .................................................. H01R 9/09
[52] U.S. Cl. .................................................. 439/70
[58] Field of Search .................................... 439/70, 66

[56] References Cited

U.S. PATENT DOCUMENTS

| 2,367,512 | 1/1945 | MacFadden | 439/70 |
| 5,109,320 | 4/1992 | Boudelaise et al. | 439/66 |
| 5,669,774 | 9/1997 | Gabbe | 439/70 |
| 5,810,607 | 9/1998 | Shih et al. | 439/66 |
| 5,829,988 | 11/1998 | McMillan et al. | 439/70 |

*Primary Examiner*—Neil Abrams
*Assistant Examiner*—J. F. Duverne
*Attorney, Agent, or Firm*—Flehr Hohbach Test Albritton & Herbert LLP

[57] ABSTRACT

A test socket for ball grid array packages (BGA) for integrated circuits is described. The socket includes a basket or cradle shaped to receive the balls of the BGA in individual electrically conductive receptacles. The receptacles have flexible walls and an elastomer disposed outside the walls. The BGA, carrying the balls is urged in a direction parallel to the plane of the BGA thereby carrying the basket in the same direction. A stop is provided to limit the movement of the basket so that further movement of the BGA causes compression of the elastomer so as to provide an electrical connection between each ball and its associated receptacle despite any minor differences in the sizes or locations of the individual balls. Means are provided for connecting each of the receptacles to an external circuit.

2 Claims, 1 Drawing Sheet

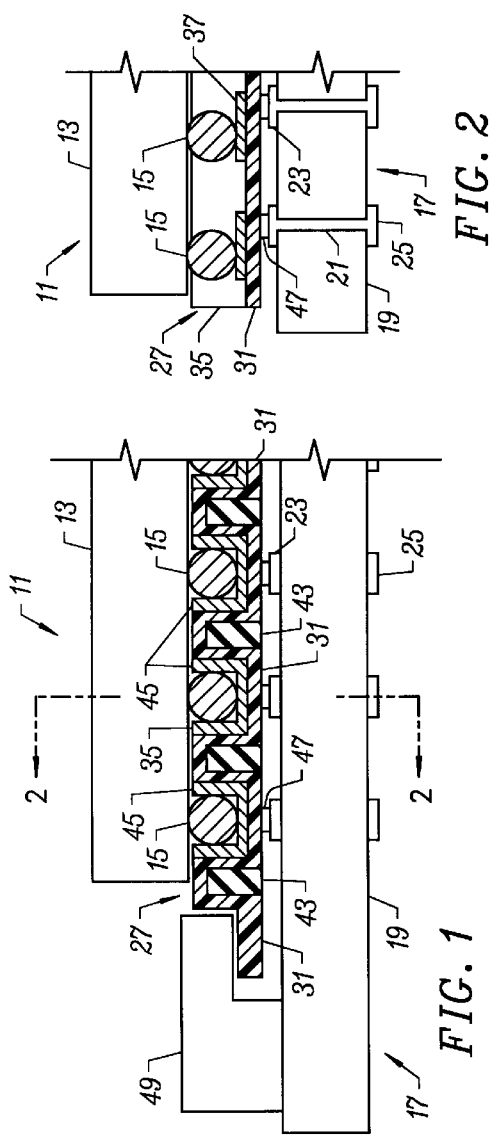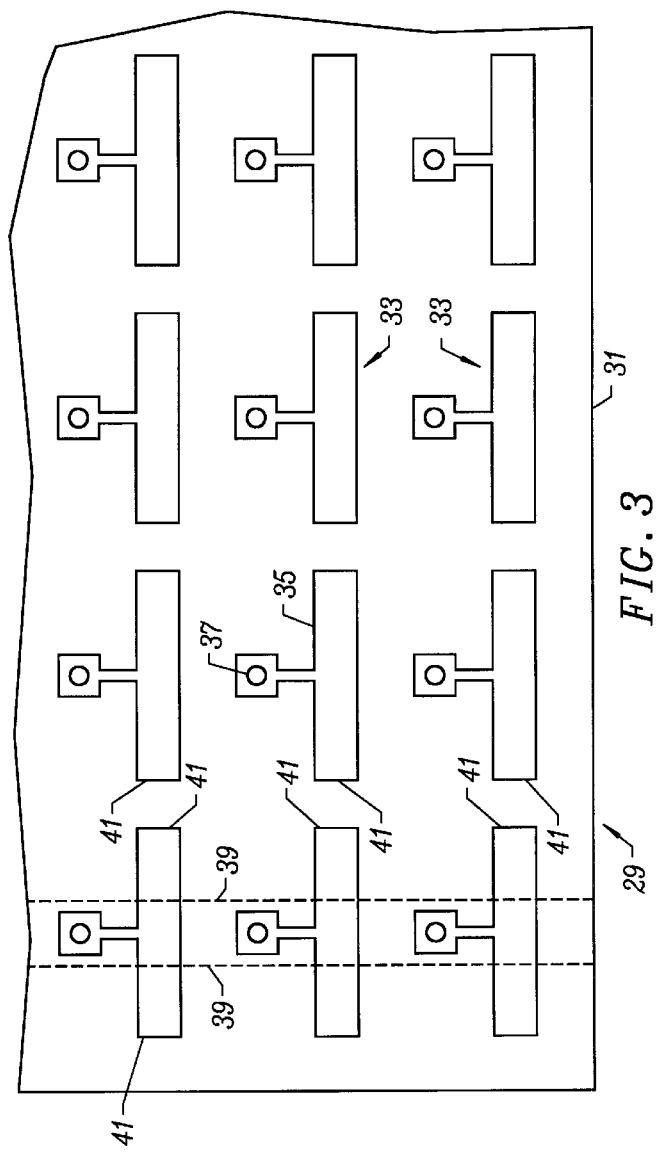

PRODUCTION AND TEST SOCKET FOR BALL GRID ARRAY SEMICONDUCTOR PACKAGE

FIELD OF THE INVENTION

This invention relates generally to the field of integrated circuits and more particularly to a high performance sockets for use with ball grid array (BGA) prototype integrated circuit packages during debugging or "bum-in" and for production BGA's when upgrade or replacement of the package is planned or otherwise expected.

BACKGROUND OF THE INVENTION

In the packaging of integrated circuit devices, including memory devices and other integrated circuits, the use of BGA's has become increasingly popular in that they permit a very high density of inter-connections; provide a relatively low package profile; have very short lead lengths which provides improved electrical characteristics; and they may be utilized in multiple chip devices. Usually, the balls of a BGA are soldered to an array of pads on a printed circuit board for permanent connection to leads extending to other circuitry. However, in many instance, particularly during prototype debugging or bum-in, BGA's are removably placed in a socket for testing or operating Test and bum-in BGA sockets have been available for several years. Ordinarily, these sockets include a printed circuit board having an array of electrically conductive pads on its surface. The pads match the arrangement of the balls on the BGA to be inserted. The BGA is then placed in the socket and is pressed against the array of pads by a force normal to the package itself. In order to guarantee electrical contact, the typically required pressure load applied to contacts is about 50 to 100 grams per contact. Therefore, when there are high ball counts, the mechanism to apply a uniform force is large and cumbersome. Slight variations in the size of the balls can require particularly excessive force, sufficient to bend the printed circuit board itself so as to force all of the balls into contact with the underlying pads.

In addition to the high force required with the existing test and bum-in sockets, they typically have a very large inductance, in the order of more than 10 mH per ball. This large inductance makes such sockets unsuitable for production use.

BRIEF SUMMARY OF THE INVENTION

In accordance with the invention, a socket is provided in which the loads are applied parallel to the printed circuit board itself rather than normal to it. Each of the individual balls makes electrical contact with a conductive pad disposed normally to the plane of the printed circuit board itself. The conductive pads are resiliently urged against the sides of the balls.

The socket includes a folded flex circuit tape having metallized circuit contacts on its surface forming the conductive pads. The tape is folded in a crenelated fashion in such a way as to receive the balls. An elastomer is placed between the balls and their respective conductive pads to maintain a relatively constant contact force on the individual balls despite slight dimensional discrepancies. The metallized contacts, of course, are each connected to individual pads for connecting to various circuits for testing, bum-in or other purposes.

The overall package has a very low profile adding less than twenty mils (about 0.5 mm) to the overall package stand-off. Such a profile allows the socket to be used in prototype system environments without modifying the system to accommodate mechanical clamps. Moreover, the top of the package, unlike the usual test and burn-in sockets for BGA's, is not blocked. Therefore, production heat sinks can be employed directly on the package.

BRIEF DESCRIPTION OF THE DRAWINGS

Additional objects and features of the invention will be more readily apparent from the following detailed description and appended claims when taken in conjunction with the drawing, in which:

FIG. 1 is a view, partially in section, showing a ball grid assembly disposed in a production socket in accordance with the invention;

FIG. 2 is a sectional view taken along the lines II—II of FIG. 1; and

FIG. 3 is a view of a portion of flex circuit tape formed with metalization to create an electrical circuit from the individual balls of the ball grid assembly to an external circuit.

DESCRIPTION OF THE PREFERRED EMBODIMENT

Referring to the drawing, there is shown in FIG. 1, a ball grid array (BGA) 11 including a package 13 which encloses one or more integrated circuits and various electrical connections. The ball grid array also includes a plurality of balls or solder bumps 15 which are connected to the integrated circuit board within the package 13 usually through a series of vias in the integrated circuit itself. In addition, there is shown a socket body 17 mounted to a printed wiring board 19. The printed wiring board 19 also includes a plurality of electrical conductors such as the plated through the hole conductors 21 (see FIG. 2) extending through the printed wiring board itself. The conductors 21 include surface mount pads 23 on the upper side of the printed wiring board 19 and external circuit connecting pads 25 at the bottom of the board.

A basket or cradle 27 is provided on the printed wiring board 19 for receiving the BGA 11, specifically the balls 15 thereof, to make electrical contact through the surface mount pads 23 and the conductors 21 to the circuit connecting pads 25. The basket 27 (as shown in FIG. 3) is preferably formed from a flex circuit made from 75 µm thick polymide with copper conductors, such as commonly used for TAB (tape automated bonding) tape.

Referring specifically to FIG. 3, a flex circuit tape 29 is shown in its initial flat condition. The tape 29 includes a flexible non-conductive base or substrate in the form of a tape 31. A series of pads 33, formed of metal or other conductive material, are disposed on the tape 31. Each of the pads 33 includes what will later be a ball contact portion 35 and a punched via 37 through both the metal pads 33 and the substrate 31. The punched via 37 is plated or otherwise coated with a conducting material to provide electrical continuity from the ball contact portion 35 through the bottom of the tape 31.

The initially flat tape 31 is folded to form the basket 27. At each row of the metallized portions, the tape is folded upwardly by 90° (from the plane of the paper as shown in FIG. 3) at the dashed lines 39 and, along the edges 41 of the metal contact portions 35, downwardly by 90° (back to a plane parallel to the plane of the paper as shown in FIG. 3). With such folding, the tape takes on the crenelated configuration as shown in FIG. 1. As shown in FIG. 1, the crenelated substrate 31 and metal ball contact portions 35 are such as to receive the balls 15 from the BGA. In addition, an elastomer cushion 43 is disposed between the upwardly extending arms 45 of adjacent metal contacts 35. As seen more clearly in FIG. 2, the vias 37 extend through the tape 31 and are connected to the surface mount pads 23 by means of solder or an electrically conductive adhesive 47.

In operation, a BGA 11 is placed into the socket body 17 and particularly the balls 15 of the BGA are inserted in the channels formed by the crenelated basket 27. In order to assure electrical contact, the elastomer 43 applies pressure to the edge of the solder balls 15 as the solder balls are pressed into the crenelated basket 27.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For instance, crenelated basket need not be formed of flex tape, but may well be formed of a more rigid substrate so long as the crenelated substrate provides sufficient flexibility to permit enough movement of the BGA after contact with the stop 49 to allow all the balls of the BGA to contact their associated metal contacts.

I claim:

1. A socket for receiving a ball grid assembly package of the type including a semiconductor integrated circuit and an array of ball contacts for electrical connection to individual elements of said circuit comprising:

a printed wiring board defining an opening extending therethrough for each of the ball contacts of said array;

an electrical conductor extending through each of said openings, each of said electrical conductors having a first contact pad at the end of said openings on one side of said printed wiring board and a second contact pad at the end of said openings on other side of said printed wiring board;

a plurality of ball receiving members extending from said printed wiring board, each of said ball receiving members including;

an electrically conductive contact extending normally to said printed wiring board and having a surface for contacting individual ones of said ball contacts of said array;

a resilient backing disposed adjacent the surface of said electrically conductive contact opposite the surface for contacting said ball contacts;

an electrical connection from said electrically conductive contact to one of said first contact pads;

a stop element disposed in a fixed position relative to said printed wiring board and aligned parallel to said electrically conductive contacts; and said plurality of ball receiving members being movable toward said stop element;

whereby, on movement of said array of ball contacts toward said electrically conductive contacts, said resilient backing is selectively compressed between said stop elements and said balls to accommodate minor misplacement of individual ones of said array of balls while ensuring electrical contact between each of said balls and its associated electrical conductor.

2. A socket for receiving a ball grid assembly package as defined in claim 1 wherein said ball receiving members are secured to an electrically non-conductive tape said tape having thereon a plurality of electrically conductive portions disposed on one side of said tape in an array complementary to the array of balls on said ball grid assembly package; a plurality of electrical contacts for connecting said balls to an external circuit.

* * * * *